(12) United States Patent
Deshpande et al.

(10) Patent No.: US 8,089,794 B1
(45) Date of Patent: Jan. 3, 2012

(54) PRECHARGE CIRCUITS AND METHODS FOR CONTENT ADDRESSABLE MEMORY (CAM) AND RELATED DEVICES

(75) Inventors: Chetan Deshpande, San Jose, CA (US); Bindiganavale S. Nataraj, Cupertino, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 7 days.

(21) Appl. No.: 12/861,084

(22) Filed: Aug. 23, 2010

Related U.S. Application Data

(63) Continuation of application No. 12/069,093, filed on Feb. 6, 2008, now Pat. No. 7,800,930.

(51) Int. Cl.
*G11C 15/00* (2006.01)
(52) U.S. Cl. ............... 365/49.17; 365/49.1; 365/203
(58) Field of Classification Search ........... 365/49.17, 365/49.1, 203
See application file for complete search history.

(56) References Cited

U.S. PATENT DOCUMENTS

| | | | |
|---|---|---|---|
| 5,621,677 A | 4/1997 | Jones | |
| 6,191,970 B1 | 2/2001 | Pereira | |
| 6,243,280 B1 | 6/2001 | Wong | |
| 6,430,074 B1 | 8/2002 | Srinivasan | |
| 6,515,884 B1 * | 2/2003 | Sywyk et al. | 365/49.15 |
| 6,804,133 B1 | 10/2004 | Khanna | |
| 7,095,674 B2 * | 8/2006 | Spix et al. | 365/230.05 |
| 7,800,930 B1 * | 9/2010 | Deshpande et al. | 365/49.17 |

OTHER PUBLICATIONS

Pending U.S. Appl. No. 12/069,093 by Chetan Deshpande et al., filed Feb. 6, 2008.

* cited by examiner

*Primary Examiner* — Son Dinh
*Assistant Examiner* — Nam Nguyen
(74) *Attorney, Agent, or Firm* — Haverstock & Owens, LLP (57) ABSTRACT

A method may include selectively coupling a result line to a reference node in response to a compare data value being applied to a plurality of compare cell circuits; precharging the result line to the precharge potential by enabling a first precharge path while the compare data value is being applied; and after precharging the result line by enabling the first precharge path, disabling the first precharge path to place it in a high impedance state.

18 Claims, 10 Drawing Sheets

PRECHARGE CIRCUITS AND METHODS FOR CONTENT ADDRESSABLE MEMORY (CAM) AND RELATED DEVICES

This application is a continuation of U.S. patent application Ser. No. 12/069,093 filed on Feb. 6, 2008, now U.S. Pat. No. 7,800,930 issued on Sep. 21, 2010.

TECHNICAL FIELD

The present invention relates generally to integrated circuit devices that can precharge a result line to one potential, and then discharge the result line toward another potential in response to a data compare operation, and more particularly to precharging match lines in content addressable memory (CAM) devices.

BACKGROUND OF THE INVENTION

Content addressable memory (CAM) devices, sometimes referred to as "associative memories," can receive a compare data value (sometimes referred to as a comparand or search key), and compare such a value against a number of stored data values. In most configurations, such an operation can match a compare data value against a very larger number of stored data values (e.g., thousands or millions), essentially simultaneously.

Such rapid compare functions have resulted in CAM devices enjoying wide application in various packet processing hardware devices, such as routers and network switches, to name just two. In a typical packet processing operation, a device can receive a packet. The packet can include a "header" having various data fields that indicate how the packet should be processed. The hardware device can utilize a matching function, provided by a CAM device, to compare one or more header fields to stored data values that can indicate how the packet is to be processed.

CAM devices are typically manufactured in integrated circuit form, as stand alone memory devices, or as some portion of an integrated circuit providing other functions.

Many CAM device configurations can include a number of CAM memory cells arranged in a logical fashion (e.g., rows, words, etc.) to store data values for comparison with a search key. Such CAM memory cells typically include a storage circuit for storing one or more bit values as well as a compare circuit for comparing the stored data value(s) with corresponding portions of a received search key.

To better understand various aspects of the present invention, a known CAM device circuit will briefly be described.

Figure 13:
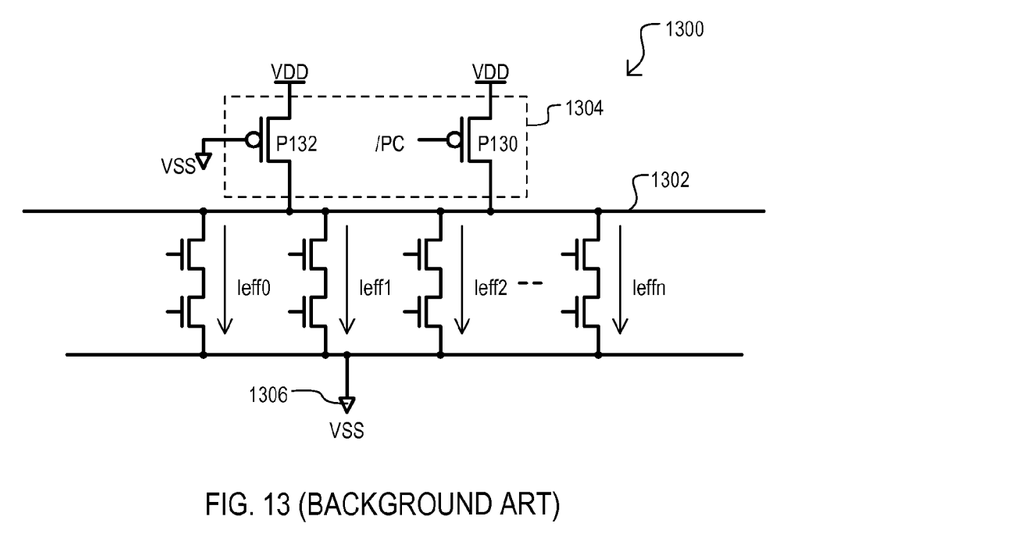
FIG. 13 is a schematic diagram showing a conventional CAM device compare circuit.

Referring now to FIG. 13, an example of a CAM device circuit is shown in a block schematic diagram and designated by the general reference character 1300. A circuit 1300 can include a match line 1302, a precharge circuit 1304 and a discharge node 1306. FIG. 13 also shows circuits equivalent to CAM cells situated in parallel with one another between match line 1302 and discharge node 1306. In the example shown, such equivalent circuits can include two n-channel metal-oxide-semiconductor (MOS) transistors having source-drain paths arranged in series with one another. It is understood that each equivalent circuit can represent all or a portion of (i.e., a leg) of a compare "stack" within a CAM cell.

A match line 1302 can provide a match indication in a compare operation. In particular, a match line 1302 can be precharged to a high power supply voltage VDD by precharge circuit 1304. In the event received compare data values are determined not to match data values stored in corresponding CAM cells, one or more CAM cells can provide a low impedance path between match line 1302 and discharge node 1306. In contrast, in the event received compare data values are determined to match data values stored in corresponding CAM cells, the CAM cells can all maintain high impedance paths between match line 1302 and discharge node 1306, maintaining match line 1302 at the precharged level.

In FIG. 13, precharge circuit 1304 can include an "AC" precharge p-channel MOS (PMOS) transistor P130 and a "DC" precharge PMOS transistor P132. Transistor P130 can have source-drain path connected between a high power supply voltage VDD and match line 1302, and a gate connected to receive precharge signal /PC. Precharge signal /PC can be activated (go low in this example) prior to a compare operation. This can ensure a match line 1302 is at a precharge level prior to the application of compare data. DC precharge transistor P132 can have source-drain path connected between a high power supply voltage VDD and match line 1302, in parallel with that of transistor P130, and can have a gate connected to a low power supply voltage VSS. In this arrangement, transistor P132 can be an "always on" transistor.

While CAM cells would ideally provide complete electrical isolation between a match line 1302 and discharge node 1306 in all but the mismatch case, in most cases a compare stack for each CAM cell can draw some amount of leakage current. Leakage currents for CAM cells are thus shown in FIG. 13 as Ieff0 to Ieffn. In such an arrangement, it is understood that CAM cells can draw a total leakage current that is the sum of Ieff0 to Ieffn, or a saturation current of DC precharge transistor P132.

U.S. Pat. No. 6,804,133 issued to Sandeep Khanna on Oct. 12, 2004 shows, among other matters, a match line control circuit that can adjust the charge current for a match in response to a valid bit and a pre-charge signal.

DETAILED DESCRIPTION

Various embodiments of the present invention will now be described in detail with reference to a number of drawings. The embodiments include circuits and methods for controlling the precharging of a result line to a precharge potential, where such a result line can be selectively driven toward a reference voltage according to a comparison operation.

Figure 1A:
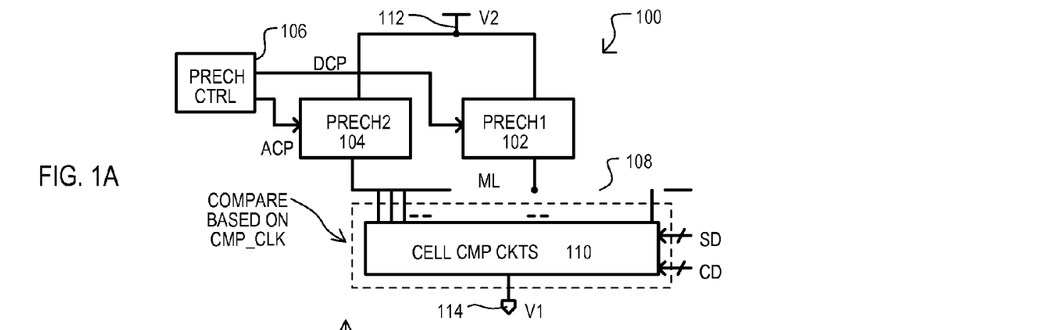
FIG. 1A is a block schematic diagram of a compare circuit according to a first embodiment of the invention.

Referring now to FIG. 1A, a compare circuit according to a first embodiment is shown in a block schematic diagram and designated by the general reference character 100. A compare circuit 100 can include a first precharge circuit 102, a second precharge circuit 104, a precharge control circuit 106, a result line 108, and a number of cell compare circuits 110.

A first precharge circuit 102 can provide a current path between result line 108 and a first potential node 112 according to control value DCP provided from precharge control circuit 106. It is understood that a control value DCP can be one signal, or a collection of signals. In a similar fashion, second precharge circuit 104 can also provide a current path between result line 108 and first potential node 112. However, second precharge circuit 104 can controlled according to a control value ACP provided from precharge control circuit 106. As in the case of control value DCP, control value ACP can be one signal, or a collection of signals.

A precharge control signal 106 can generate control values DCP and ACP that can place first and second precharge circuits (102 and 104) into high or low impedance states. Unlike the conventional arrangement of FIG. 13, the embodiment of FIG. 1 does not include an "always on" (i.e., DC) device.

Cell compare circuits 110 can provide current paths between result line 108 and a second potential node 114 depending upon results of a compare operation between a stored value (SD) and an applied compare data value (CD). In one very particular arrangement, cell compare circuits 110 can include compare circuits for a number of content addressable memory (CAM) cells, where each CAM cell stores a portion of a stored data value (SD).

Cell compare circuits 110 can execute a compare operation within a time period established by a compare timing signal CMP_CLK. During such a time, cell compare circuits 110 can provide either a relatively high impedance or relatively low impedance depending upon a compare result. As but a few examples, such a compare result can include a matching result (i.e., compare data value matches or does not match stored data value, taking into account any masking operation), or a magnitude comparison result between one or more stored data values (i.e., greater-than, greater-than-or-equal to, less-than, less-than-or-equal-to, or within a range established by stored data values).

In this way, a result line 108 can provide a result based on a change in a precharge voltage created by a compare operation. However, precharge operations for such a result line can differ from conventional approaches.

Having described the general circuit components of the embodiment shown in FIG. 1A, an operation of this embodiment will now be described with reference to FIG. 1B.

Figure 1B:
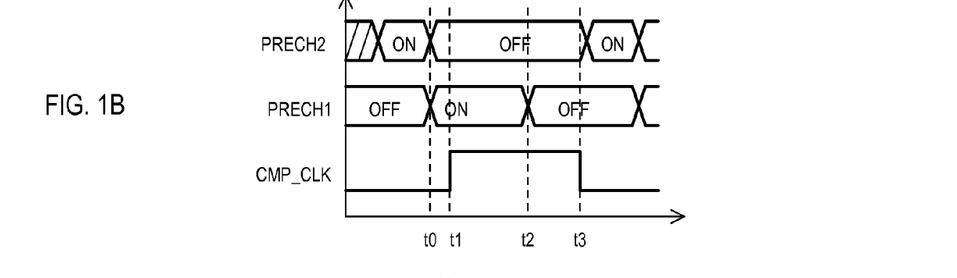
FIG. 1B is a timing diagram showing an operation of the compare circuit of FIG. 1A.

FIG. 1B is a timing diagram showing states of first precharge circuit 102 (PRECH1), second precharge circuit (PRECH2) 104, and compare timing signal CMP_CLK.

Prior to time t0, a second precharge circuit 104 can be placed into a low impedance state (ON), and thus connect a result line 108 to a precharge voltage node 112.

At time t0, a second precharge circuit 104 can be placed into a high impedance state (OFF), and thus essentially isolate result line 108 from precharge voltage node 112.

At about time t1, a first precharge circuit 102 can be in a low impedance state (ON), and thus provide a current path between first potential node 112 and result line 108. At about the same time, a compare timing signal CMP_CLK can transition to an active level (in this example high), indicating compare operations are being executed by cell compare circuits 110. Thus, depending upon the results of such a compare operation, cell compare circuits 110 may, or may not, provide a low impedance to second potential node 114. Preferably, first precharge circuit 102 can be placed into a low impedance state prior to the start of compare operations. In this way, first precharge circuit 102 can compensate for leakage through cell compare circuits 110 that might otherwise generate a false compare result. However, because first precharge circuit 102 is on during the compare operation, current can be drawn through cell compare circuits 110, particularly if any such circuits is in a low impedance state.

At about time t2, a first precharge circuit 102 can return to a high impedance state (OFF). Such an operation can thus prevent a current path through cell compare circuits 110. It is assumed that at time t2, sufficient time has passed to capture a valid compare result on result line 108.

At about time t3, a compare timing signal CMP_CLK can transition to an inactive level (in this example low), indicating a compare operation has been completed.

In this way, a precharge circuit (in the example shown, the first precharge circuit 102) can be enabled (e.g., provide a relatively low impedance) during only a portion of a compare operation. This is in contrast to a conventional arrangement like that of FIG. 13, which utilizes an "always on" DC device, that provides a current path prior to, throughout, and after a compare operation.

Figure 2A:
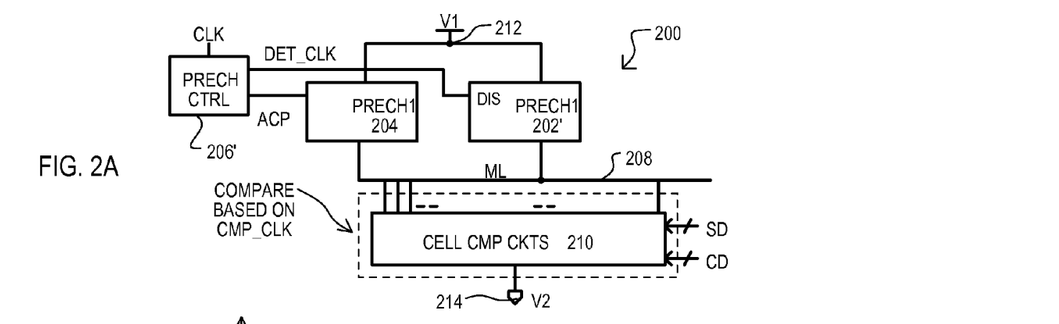
FIG. 2A is a block schematic diagram of a compare circuit according to a second embodiment of the invention.

Referring now to FIG. 2A, a compare circuit according to another embodiment is shown in a block schematic diagram and designated by the general reference character 200. A compare circuit 200 can include some of the same general sections as the embodiment of FIG. 1A, thus like sections are referred to by the same reference character but with the first digit being a "2" instead of a "1".

FIG. 2A shows a compare circuit that can provide for synchronous disable (turn off) of a first precharge circuit 202'.

Compare circuit 200 can differ from that of FIG. 1A, in that a first precharge circuit 202' can have a disable input (DIS) that can control when the first precharge circuit 202' is placed into a high impedance state. In addition, a precharge control circuit 208' can receive a periodic signal CLK, and in response, generate a control signal DET_CLK that can be applied to the disable input of first precharge circuit 202'. In one particular arrangement, a periodic signal CLK can be generated by a timing circuit (not shown) formed in a same integrated circuit substrate as compare circuit 200. Even more particularly, periodic signal CLK can be synchronous with, and generated in response to an external clock, by a circuit such as a phase locked loop (PLL) type circuit, or delay locked loop (DLL) circuit, or a clock buffer. Alternatively, such a timing signal can be generated by an oscillator circuit without regard to any timing signal.

An operation of the embodiment of FIG. 2A will now be described with reference to FIG. 2B.

Figure 2B:
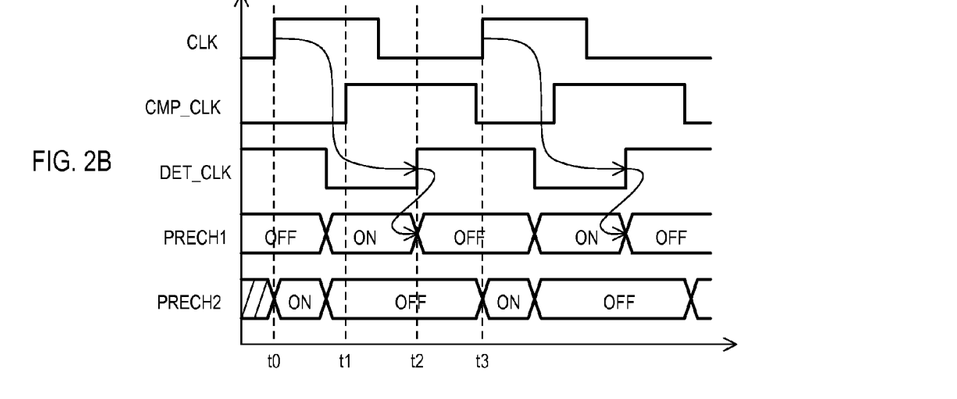
FIG. 2B is a timing diagram showing an operation of the compare circuit of FIG. 2A.

FIG. 2B is a timing diagram showing states of first precharge circuit 202'(PRECH1), second precharge circuit 204 (PRECH2), a compare timing signal CMP_CLK, as well as signals CLK and DET_CLK noted above. FIG. 2B can show similar operations to those shown in FIG. 1B, including the operation of second precharge circuit 204 and the start and stop of compare operations according to signal CMP_CLK. However, the operation of FIG. 2B can also differ from that shown in FIG. 1B as noted below.

At about time t0, periodic signal CLK can transition from a high to low level. In response to such a transition, a precharge control circuit 208' can cause a particular transition in control signal DET_CLK (in this case low-to-high, at subsequent time t2).

At about time t1, a compare operation can start, as signal CMP_CLK can transition to an active level (high). At this time, first precharge circuit 202' can be in a low impedance state.

At about time t2, in response to a low-to-high transition in signal DET_CLK, first precharge circuit 202' can be placed into a high impedance state. It is understood that signal DET_CLK is synchronous with (although not coincident to) signal CLK. In this arrangement, first precharge circuit 202' is placed into a high impedance state after a compare operation has already started at time t1, but prior to the conclusion of the compare operation at time t3.

In this way, a precharge circuit can be disabled prior to the end of a compare operation in synchronism with a periodic signal.

Figure 3A:
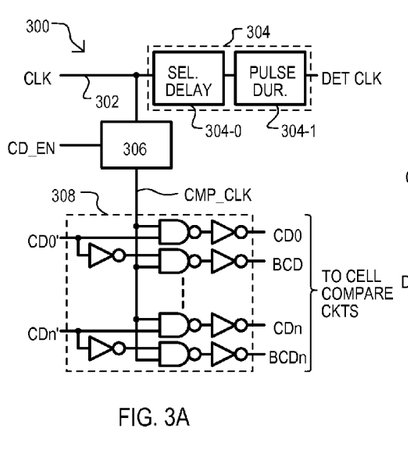
FIG. 3A is a block schematic diagram of a precharge control circuit according to an embodiment of the invention.

Referring now to FIG. 3A, an example of a precharge control circuit is shown in a block schematic diagram and designated by the general reference character 300. In one very particular arrangement, a precharge control circuit 300 can be utilized as precharge control circuit labeled 206' in FIG. 2A.

A precharge control circuit 300 can include a clock input 302, a control clock generator section 304, compare timing signal generator 306, and compare activation circuits 308. A clock input 302 can receive a periodic signal CLK generated according to any of the various techniques noted above in the description of FIG. 2A.

A control clock generator section 304 can generate a control clock DET_CLK in response to signal CLK. In the very particular example shown, clock generator section 304 can include a selectable delay circuit 304-0 and a pulse duration circuit 304-1. A selectable delay circuit 304-0 can delay a signal CLK to generate the start of a DET_CLK pulse (i.e., the pulse that turns on a first precharge circuit). Thus, a start of a DET_CLK pulse can be established by a delay introduced by selectable delay circuit 304-0. Such a programmability in a delay amount can take various forms, including but not limited to: fabrication options (e.g., metal option, bond option) to configure greater or fewer numbers of delay circuits and/or conductive lines in a signal path to thereby increase or decrease a delay amount; nonvolatile post manufacture options to establish delay circuit states (e.g., selectively opening fuses, selectively enabling antifuses, or programming nonvolatile memory cells), or volatile options (writing values to a register, or the like).

A pulse duration circuit 304-1 can establish the duration of an active control clock DET_CLK pulse, and thus dictate when a DET_CLK pulse ends. In one arrangement, a pulse duration circuit 304-1 can terminate a DET_CLK pulse a predetermined time after it starts. In an alternate arrangement, a pulse duration circuit 304-1 can terminate a DET_CLK pulse in response to another signal or event, such as a potential of result line 308, or compare timing signal CMP_CLK, as but two examples.

A compare timing signal generator 306 can generate compare timing signal CMP_CLK in response to signal CLK and an enable signal CD_EN. An enable signal CD_EN can be generated in response to command decoder circuits, or the like, that can signify when a compare operation is to take place. Thus, if a signal CD_EN indicates a compare operation is to take place, compare timing signal generator 306 can activate signal CMP_CLK (drive it high in this example). However, if CD_EN indicates a compare operation is not to place, signal CMP_CLK can remain inactive.

Compare activation circuits 308 can start a compare operation that has the potential to change the voltage of a result line by creating current paths through cell compare circuits. In the very particular example of FIG. 3A, compare activation circuits 308 can be compare data driver circuits that apply compare data values to compare circuits. More particularly, compare activation circuits can include compare data line pairs CD0/BCD0 to CDn/BCDn. Each compare data line pair (CD0/BCD0 to CDn/BCDn) can be driven to a same disable potential (logic low in this example) when a compare timing signal CMP_CLK is inactive (low in this example). When compare timing signal is active, each compare data line pair (CD0/BCD0 to CDn/BCDn) can be driven to complementary compare data values according to input compare data values CD0' to CDn'. In other arrangements, compare data line pairs can be driven to a masking value (e.g., both low) according to a global mask value.

Figure 3B:
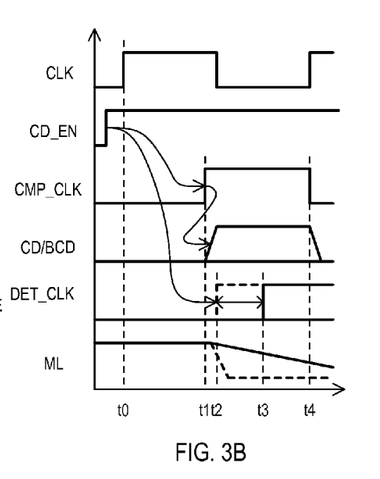
FIG. 3B is a timing diagram showing an operation of the circuit of FIG. 3A.

An operation of the precharge control circuit 300 of FIG. 3A is shown in a timing diagram in FIG. 3B. FIG. 3B is a timing diagram showing waveforms for signal CLK, value CD_EN, signal CMP_CLK, the response of compare data line pairs (CD/BCD), variations in detect clock DET_CLK according to programmed delay amount, and variations in a result line potential (ML).

At time t0, a signal CLK can transition from low-to-high. At the same time, value CD_EN is active, indicating a compare operation is to take place. At this time, signal CMP_CLK is low thus compare activation circuit 308 can force compare data line pairs to an inactive level, thus maintain corresponding cell compare circuits (not shown) in high impedance states.

In response to the states of signals CLK and CD_EN at time t0, timing signal generator 306 can activate signal CMP_CLK at about time t1. This can result in compare activation circuits 308 driving compare data line pairs CD/BCD to complementary values according to received input compare data values. As a result, depending upon a comparison result, one or more cell compare circuits can be placed into a low impedance state.

According to a selectable delay value established according to any of the techniques noted above, a detect clock DET_CLK can be activated over a range of time periods, shown in FIG. 3B as dashed lines between times t2 and t3. The ability to select different delays can allow a precharge arrangement like that of FIG. 3A to accommodate variations in result line response.

FIG. 3B shows two different responses of a result line (ML) by dashed and solid lines. The two different responses can represent different "worst case" responses of a result line in a compare operation. As but one example, there can be cases in which an applied compare data value results in only one cell compare circuit (from among multiple such circuits) providing a low impedance current path. Thus, the rate at which a result line changes state in this "worst case" can be slower than other cases in which multiple cell compare circuits provide low impedance paths.

The dashed line responses at time t2 show a worst case result response that can be relatively fast. That is, in this worst case, a sufficient change in potential can be generated on a result line to allow a valid result to be detected at time t2. In such a case, a selectable delay of precharge circuit (e.g., 300) can be set to activate signal DET_CLK at time t2. In contrast, the solid line responses at time t3 shows a case in which a worst case result response can be relatively slow. In such a case, the selectable delay can be increased to activate signal DET_CLK at time t3. Changes in result line response can result from variations in operating temperature, voltage or manufacturing process, or by differences in match line size, as but a few examples.

In this way, a precharge circuit enabled during a first part of compare operation can be disabled prior to the end of the compare operation. Such a disable operation can be in synchronism with a periodic signal, and according to a selectable delay value.

Figure 4A:
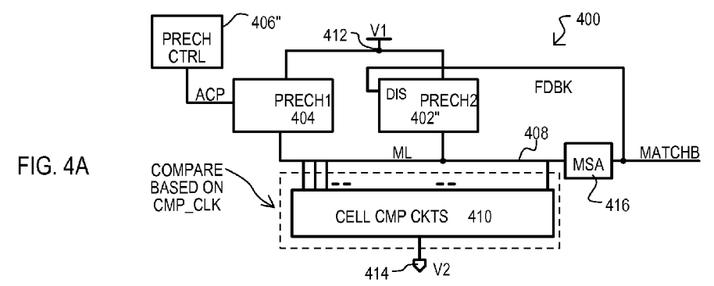
FIG. 4A is a block schematic diagram of a compare circuit according to a third embodiment of the invention.

Referring now to FIG. 4A, a compare circuit according to another embodiment is shown in a block schematic diagram and designated by the general reference character 400. A compare circuit 400 can include some of the same general sections as the embodiment of FIG. 1A, thus like sections are referred to by the same reference character but with the first digit being a "4" instead of a "1".

FIG. 4A shows a compare circuit that can provide for asynchronous disable (turn off) of a first precharge circuit 402". More particularly, the disabling of a first precharge circuit can be conditioned on a result line potential.

FIG. 4A can differ from that of FIG. 1A, in that it shows a sense amplifier circuit 416 that can detect a state of result line 408 to generate a feedback signal FDBK. A first precharge circuit 402" can have a disable input (DIS) that receives feedback signal FDBK.

An operation of the embodiment of FIG. 4A will now be described with reference to FIG. 4B.

Figure 4B:
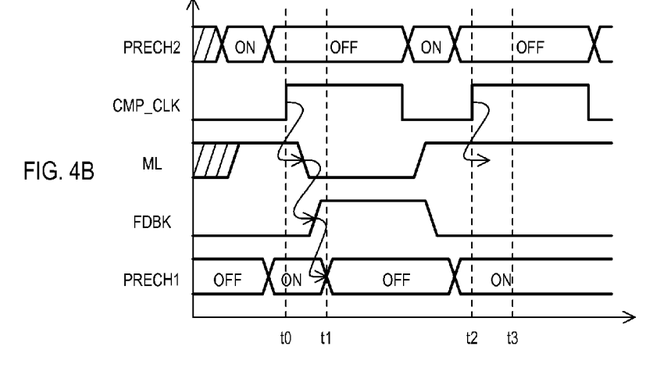
FIG. 4B is a timing diagram showing an operation of the compare circuit of FIG. 4A.

FIG. 4B is a timing diagram showing states of first precharge circuit 402" (PRECH1), second precharge circuit 404 (PRECH2), a compare timing signal CMP_CLK, a response of result line 408 (ML), and a feedback signal FDBK. FIG. 4B can show similar operations to those shown in FIG. 1B, including the operation of second precharge circuit 404 and the start and stop of compare operations according to signal CMP_CLK. However, the operation of FIG. 4B can also differ from that shown in FIG. 1B as noted below.

At about time t0, a compare operation can begin, as compare timing signal CMP_CLK transitions to a high level. At this time, a first precharge circuit 402" can be in a low impedance state. In the example shown, the compare operation starting at time t0 results in result line 408 changing in potential. This change in potential can be detected by sense amplifier 416, which can then drive signal FDBK from a low level to a high level.

At time t1, in response to feedback signal FDBK transitioning high, first precharge circuit 402" can be placed into a high impedance state. This can reduce the amount of current passing through any cell compare circuits. At this time, compare timing signal CMP_CLK can still be active.

At about time t2, a next compare operation can begin, as compare timing signal CMP_CLK once again transitions to a high. This time, the compare operation starting at time t2 does not cause any substantial change in the potential of in result line 408. That is, no change in the potential of result line 408 is detected by sense amplifier 416, and signal FDBK can remain at a low level. Such an operation can result from all of cell compare circuits 410 maintaining a high impedance state.

At time t3, because feedback signal FDBK remains low, first precharge circuit 402" can remain in a low impedance state. Because cell compare circuits can all be in a high impedance state, maintaining first precharge circuit 402" does not result in any substantial draw of current.

In this way, a precharge circuit enabled during a first part of compare operation can be disabled prior the end of the compare operation. Such a disable operation can be essentially asynchronous with a timing signal, as well as conditioned on a change in potential of a corresponding result line.

Figure 5A:
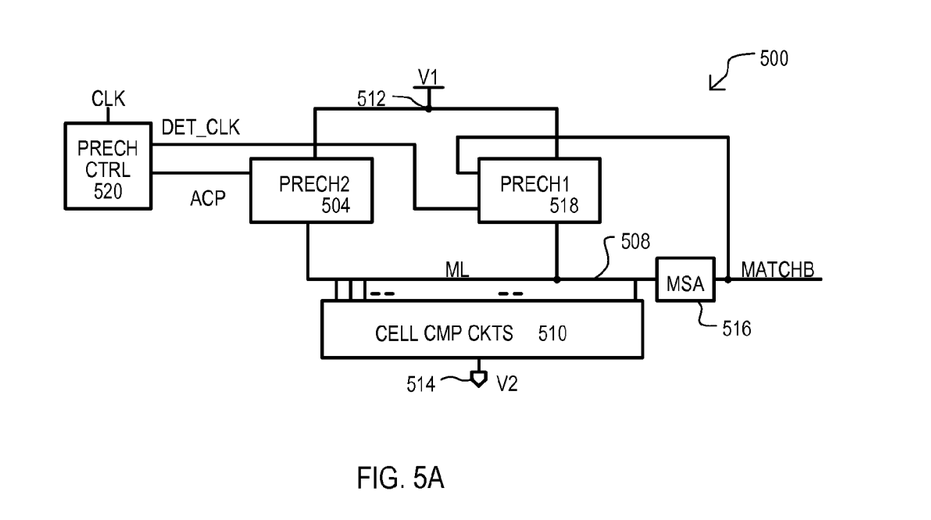
FIG. 5A is a block schematic diagram of a compare circuit according to a fourth embodiment of the invention.

Referring now to FIG. 5A, a compare circuit according to another embodiment is shown in a block schematic diagram and designated by the general reference character 500. A compare circuit 500 can include some of the same general sections as the embodiment of FIG. 1A, thus like sections are referred to by the same reference character but with the first digit being a "5" instead of a "1".

FIG. 5A shows a compare circuit that can disable a first precharge circuit 518 based on a combination of both a synchronous signal DET_CLK and a potential generated on result line 508 during the compare operation. More particularly, whether or not a precharge circuit is disabled according to a periodic signal can be conditioned on the result line potential.

FIG. 5A can differ from that of FIG. 1A, in that it shows a sense amplifier circuit 516 that can detect a state of result line 508 to generate a feedback signal FDBK. In addition, a first precharge circuit 518 can receive both a feedback signal FDBK and a control signal DET_CLK.

An operation of the embodiment of FIG. 5A will now be described with reference to FIG. 5B.

Figure 5B:
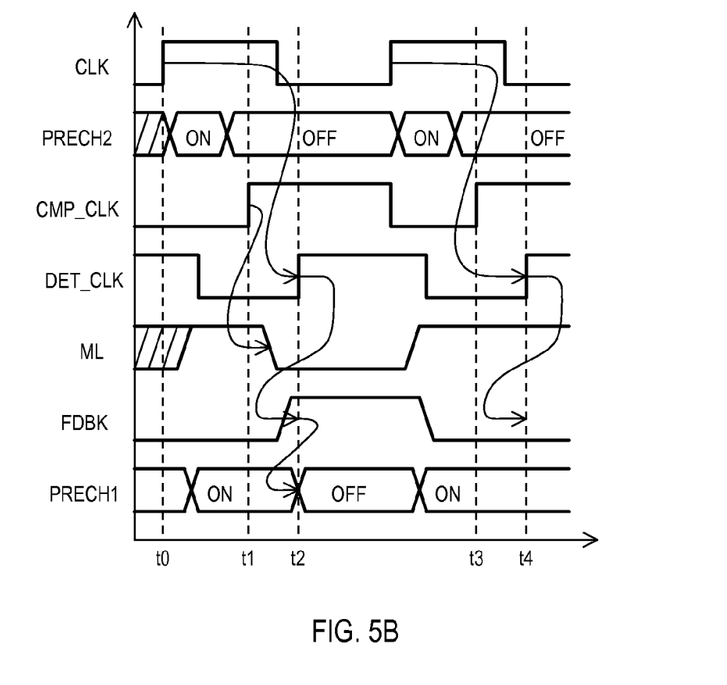
FIG. 5B is a timing diagram showing an operation of the compare circuit of FIG. 5A.

FIG. 5B is a timing diagram showing states of first precharge circuit 518 (PRECH1), second precharge circuit 504 (PRECH2), a compare timing signal CMP_CLK, a response of result line 508 (ML), and a feedback signal FDBK. FIG. 5B can show similar operations to those shown in FIG. 2B, including the operation of second precharge circuit 504 and the start and stop of compare operations according to signal CMP_CLK. However, the operation of FIG. 5B differs from that of FIG. 2B in that the disabling of first precharge circuit 518 can be conditioned on the state of result line 508 (as detected by sense amplifier 516).

As shown in FIG. 5B, at about time t0, periodic signal CLK can transition from a low to high level. In response to such a transition, a precharge control circuit 520 can cause a particular transition in control signal DET_CLK (in this case low-to-high, at subsequent time t2).

At about time t1, a compare operation can begin, as compare timing signal CMP_CLK transitions to a high level. At this time, a first precharge circuit 518 can be in a low impedance state. In the example shown, the compare operation starting at time t1 causes result line 508 to change in potential.

This change in potential is detected by sense amplifier 516, which can then drive signal FDBK from a low level to a high level.

At about time t2, signal DET_CLK can transition from a low-to-high level. Because signal FDBK is high, in response to the DET_CLK transition, first precharge circuit 518 can be placed into a high impedance state.

At about time t3, a next compare operation can begin, as compare timing signal CMP_CLK once again transitions to a high. This time, the compare operation starting at time t3 causes no substantial change in result line 508, and signal FDBK can remain at a low level. Because signal FDBK is low when signal DET_CLK transitions high at time t4, first precharge circuit 518 does not switch to a high impedance state, but rather remains in the low impedance state.

In this way, a precharge circuit can be enabled during a first part of compare operation and disabled prior the end of a compare operation. Such a disable operation can be both synchronous with a periodic signal and conditioned on a change in potential of a corresponding result line.

Figure 6A:
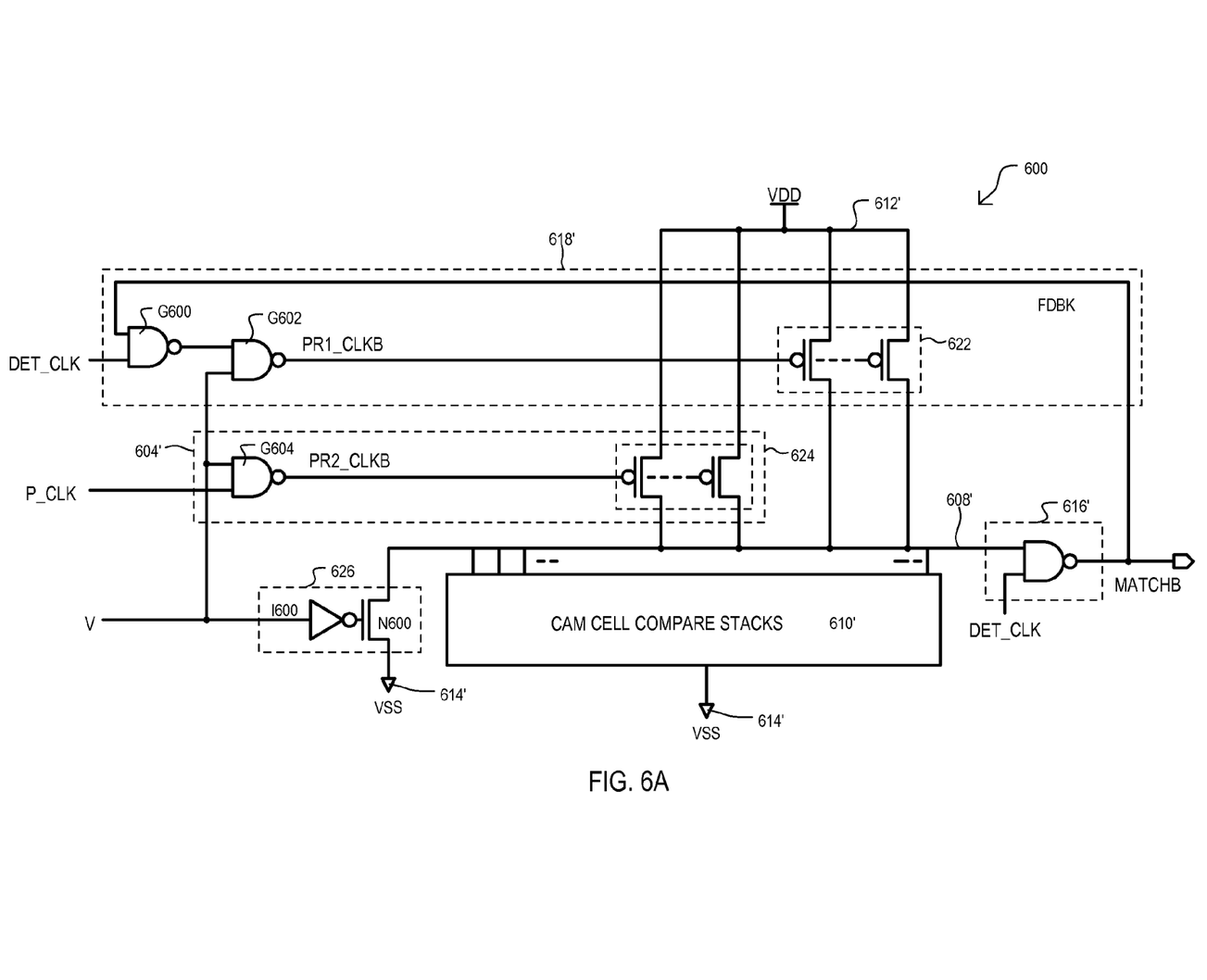
FIG. 6A is a block schematic diagram of a content addressable memory (CAM) device compare circuit according to a fifth embodiment of the invention.

Referring now to FIG. 6A, a compare circuit according to another embodiment is shown in a block schematic diagram and designated by the general reference character 600. A compare circuit 600 can include some of the same general sections as the embodiment of FIG. 5A, thus like sections are referred to by the same reference character but with the first digit being a "6" instead of a "5".

FIG. 6A shows another compare circuit that can disable a first precharge circuit 618' based on a combination of both a synchronous signal DET_CLK and a potential generated on result line (which in this case can be a match line 608') during the compare operation.

In the very particular example of FIG. 6, a first precharge circuit 618' can include a first logic gate G600, a second logic gate G602, and one or more first precharge transistors 622. A first logic gate G600 can be a NAND gate having a first input that receives a control signal DET_CLK and a second input that receives a feedback signal FDBK provided by sense amplifier 616'. Second logic gate G602 can also be a NAND gate having a first input connected to the output of first logic gate G600, a second input that receives a valid value V, and an output that provides a first precharge signal PR1_CLKB. First precharge transistors 622 can include one or more p-channel insulated gate field effect transistors (FETs) having source-drain paths arranged in parallel with one another between a high power supply node 612' and match line 608'. According to a desired precharge strength, a gate of one or more such transistors can be connected to receive first precharge signal PR1_CLKB. As but one very particular example, a metal option (manufacturing layer) can be used to determine how many of first precharge transistors 622 can be enabled by signal PR1_CLKB.

A second precharge circuit 604' can include a third logic gate G604 and one or more second precharge transistors 624. A third logic gate G600 can be a NAND gate having a first input that receives a precharge signal P_CLK, a second input that receives a valid value V, and an output that provides a second precharge signal PR2_CLKB. Second precharge transistors 624 can also include one or more p-channel FETs having source-drain paths arranged in parallel with one another between a high power supply node 612' and match line 608'. As in the case of first precharge transistors 622, according to a desired precharge drive strength, a gate of one or more second precharge transistors 624 can be connected to receive second precharge signal PR2_CLKB.

Cell compare circuits in FIG. 6 can be CAM cell compare circuits 610'. That is, CAM cell compare circuits 610' can include multiple controllable current paths arranged between match line 608' and a low power supply node 614'. In a compare operation, timed according to a compare control signal CMP_CLK, each such controllable current path can provide either a high impedance or low impedance according to a bit wise comparison between a stored data bit value, and a corresponding compare data bit value. Optionally, such compare results can be masked (forced to a high or low impedance state regardless of a compare result).

A sense amplifier 616' can include a NAND gate having a first input connected to match line 608', a second input that receives control signal DET_CLK, and an output that provides a match result MATCHB. A match result MATCHB can also serve as the feedback signal FDBK. In FIG. 6A, a high MATCHB signal can indicate a miss (i.e., no match) result, while a low MATCHB signal can indicate a match result.

Unlike the arrangement of FIG. 5A, compare circuit 600 can receives valid value V and further include a valid disable circuit 626. A valid value V can determine whether a compare result is considered valid. For example, value V can be high when data stored by CAM cells should be included in a compare operation, and can be low when data stored by CAM cells should be excluded from a compare operation.

A valid disable circuit 626 can drive match line 608' to one voltage according to a value of V. In the very particular example of FIG. 6A, a valid disable circuit 626 can include an inverter I600 and an n-channel FET N600. Inverter I600 can have an input that receives valid value V and an output that drives a gate of transistor N600. Transistor N600 can have a source-drain path connected between match line 608' and a low power supply node 614'. In such an arrangement, when a value V is low, match line 608' can be clamped to a low power supply potential VSS, and thus prevented from generating a match result.

Having described the general construction of an embodiment in FIG. 6A, the operation of the range compare circuit 600 will now be described with reference to FIG. 6B.

Figure 6B:
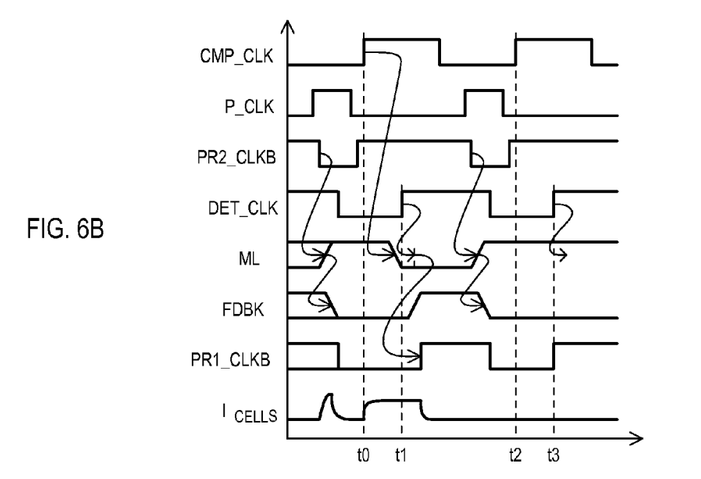
FIG. 6B is a timing diagram showing an operation of the compare circuit of FIG. 6A.

FIG. 6B is a timing diagram showing the response of various signals shown in FIG. 6A, including compare control signal CMP_CLK, a precharge clock P_CLK, a first precharge control signal PR1_CLKB, a second precharge control signal PR2_CLKB, a match line response ML, a feedback signal FDBK, and a representation of current drawn by CAM cell compare circuits $I_{CELLS}$. The responses shown in FIG. 6B assume that a valid value V is a logic high, indicating a valid compare result.

Prior to time t0, a precharge clock P_CLK can pulse active (high in this case), causing second precharge control signal PR2_CLKB to pulse low. Transistor(s) 624 can turn on, pulling match line 608' high (if not already high). At the same time, signal DET_CLK can be low, thus first precharge control signal PR1_CLKB can be low, and transistors 622 can also be on. With match line 608' pulled high and signal DET_CLK low, signal MATCHB can be low.

As shown by signal $I_{CELLS}$, because compare control signal CMP_CLK is low, CAM cell compare circuits can have a high impedance, thus relatively little current can be drawn through the CAM cells.

At about time t0, compare controls signal CMP_CLK transitions high. Because the operation shows a "miss" result, one or more CAM cell compare circuits can provide a low impedance between match line 608' and low power supply voltage VSS. At this time, first precharge transistor(s) 622 can be turned on. The amount of current drawn by the one or more low impedance CAM cell paths is more than that sourced by first precharge transistor(s). As a result, match line 608' can begin to transition low. Because signal control signal DET- _CLK is already low, this low transition does not resulting a change in signal MATCHB, which remains high.

As shown by signal $I_{CELLS}$, because first precharge transistor(s) 622 are on, and a current path exists through CAM cell compare circuits 610', a relatively large amount of current can be drawn through the CAM cells.

At about time t1, control signal DET_CLK can be activated. The activation of this signal causes first precharge control signal PR1_CLKB high to transition high, turning off transistor(s) 622.

As shown by signal $I_{CELLS}$, because first precharge transistor(s) 622 are turned off, a current supply to CAM cells can be turned off, and a relatively small amount of current can be drawn through the CAM cells.

At about time t2, another compare operation can start with compare control signal CMP_CLK again transitioning high. Because the operation shows a match ("hit") result, CAM cell compare circuits 610' can maintain a high impedance between match line 608' and low power supply voltage VSS. First precharge transistor(s) 622 can be on at this time.

As shown by waveform $I_{CELLS}$, because CAM compare cells 610' are in a high impedance state, a relatively small amount of current can be drawn through the CAM cells.

At about time t3, control signal DET_CLK can be activated. Because match line 608' is still high, signal FDBK (MATCHB) can transition low, indicating a match result. Despite such a transition in signal FDBK, first precharge control signal PR1_CLKB can remain low, keeping transistor(s) 622 on.

As shown by signal $I_{CELLS}$, at time t3, because CAM cell compare circuits 610' remain in a high impedance state, even though first precharge transistor(s) 622 remain on, a relatively small amount of current can be drawn through the CAM cells.

The above embodiments have shown arrangements in which current consumption can be reduced by including a first precharge circuit that is on during a first portion of a compare operation, and then turned off in a subsequent part of the same compare operation. However, alternate embodiments can include configurations in which precharge operations can occur prior to and after such a compare operations. A first example of such an arrangement is shown in FIGS. 7A and 7B.

Figure 7A:
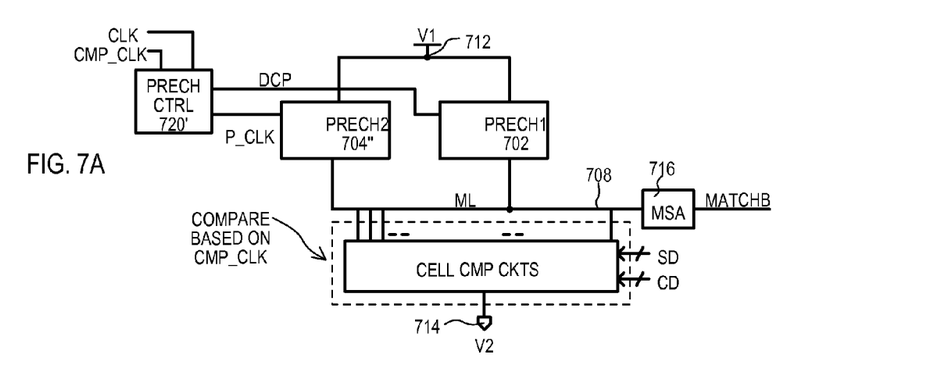
FIG. 7A is a block schematic diagram of a compare circuit according to a sixth embodiment of the invention.
Figure 7B:
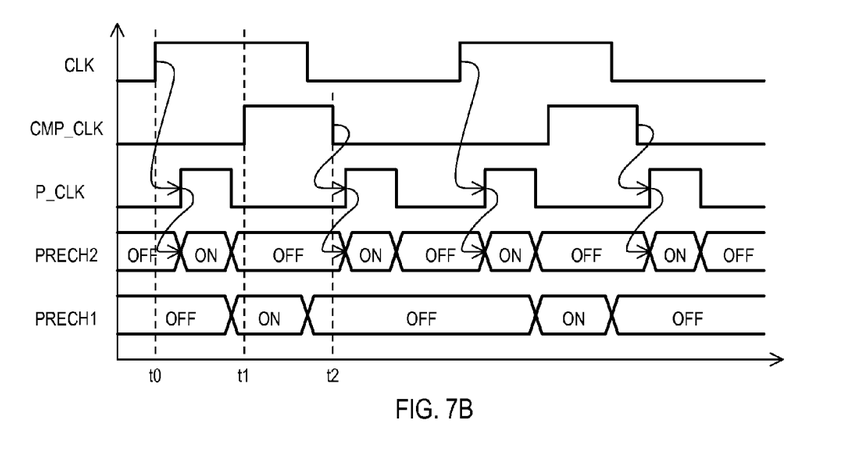
FIG. 7B is a timing diagram showing an operation of the compare circuit of FIG. 7A.

Referring now to FIG. 7A, a compare circuit according to another embodiment is shown in a block schematic diagram and designated by the general reference character 700. A compare circuit 700 can include some of the same general sections as the embodiment of FIG. 1A, thus like sections are referred to by the same reference character but with the first digit being a "7" instead of a "1".

FIG. 7A shows a compare circuit that can provide a particular precharge path both before and after a compare operation, but not during a compare operation.

Compare circuit 700 can differ from that of FIG. 1A, in that a second precharge circuit 704" can provide a low impedance path before a compare operation and after a compare operation, in two separate precharge operations. In the very particular example shown, a precharge control circuit 720' can receive a clock signal CLK and compare control signal CMP_CLK. In response to such signals, precharge control circuit 720' can activate a precharge clock signal P_CLK before a compare operation in response to a received clock signal CLK, and after the compare operation in response to a compare control signal CMP_CLK.

An operation of the embodiment of FIG. 7A will now be described with reference to FIG. 7B.

FIG. 7B is a timing diagram showing states of a clock signal CLK, a first precharge circuit 702 (PRECH1), second precharge circuit 704" (PRECH2), a compare timing signal CMP_CLK, and a resulting precharge clock signal P_CLK.

At about time t0, periodic signal CLK can transition from a low to high level. In response to such a transition, a precharge control circuit 720' can generate an active pulse in precharge clock P_CLK (in this case a high pulse). In response to the active pulse, second precharge circuit 704" can be placed into a low impedance state.

Prior to time t1, the precharge clock P_CLK can return to an inactive level, and second precharge circuit 704" can return to a high impedance state.

At about time t1, compare control signal CMP_CLK can transition to a high level, indicating the start of a compare operation.

At about time t2, a compare operation can end with compare control signal CMP_CLK returning to an inactive level. In response to signal CMP_CLK returning to a low level, precharge control circuit 720' can generate another active pulse, placing second precharge circuit 704" into a low impedance state once again.

Of course, in the arrangement of FIGS. 7A and 7B, a first precharge circuit 702 can be activated according to any of the approaches described herein.

In this way, a precharge circuit can be enabled and then disabled prior to a compare operation, and then enabled and disabled after the compare operation. Such an arrangement can draw less current than a single, relatively long pulse only prior to, or only after a compare operation.

While an embodiment like that of FIGS. 7A and 7B can automatically activate a second precharge circuit twice (prior to and after a compare operation), alternate arrangements can condition one of the precharge operations according to a compare result. One such arrangement is shown in FIGS. 8A and 8B.

Figure 8A:
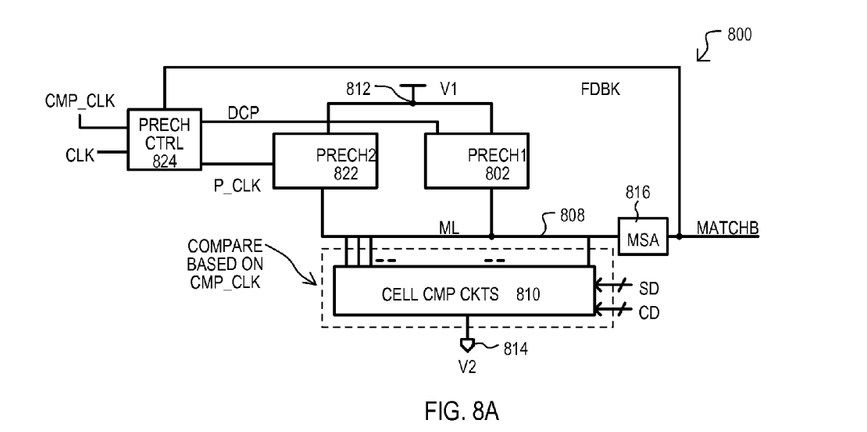
FIG. 8A is a block schematic diagram of a compare circuit according to a seventh embodiment of the invention.
Figure 8B:
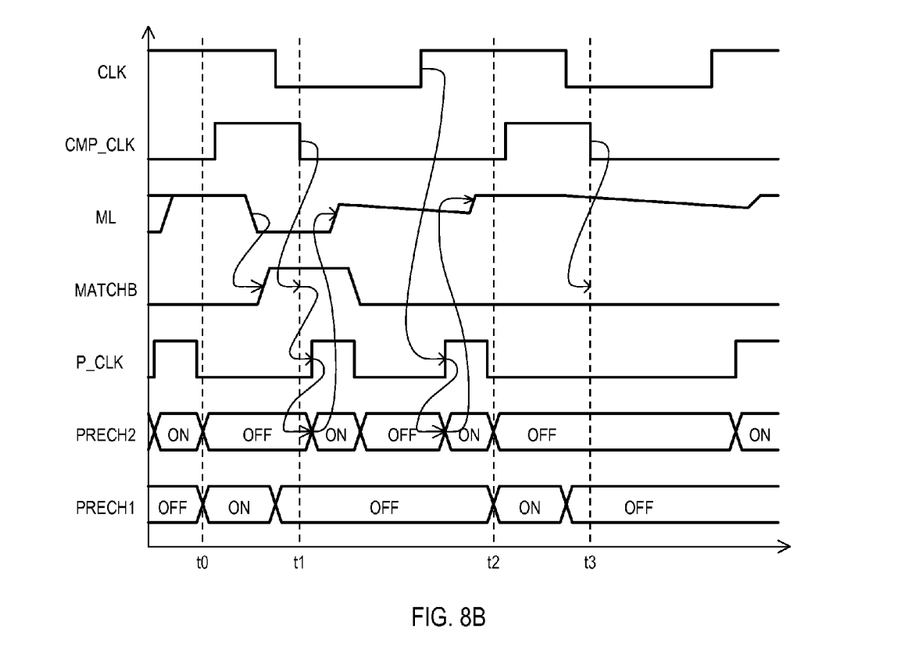
FIG. 8B is a timing diagram showing an operation of the compare circuit of FIG. 8A.

Referring now to FIG. 8A, a compare circuit according to another embodiment is shown in a block schematic diagram and designated by the general reference character 800. A compare circuit 800 can include some of the same general sections as the embodiment of FIG. 7A, thus like sections are referred to by the same reference character but with the first digit being an "8" instead of a "7".

FIG. 8A shows a compare circuit that can provide for one precharge operation prior to a compare operation, and can then condition a second precharge operation after the compare operation according to a compare result.

Compare circuit 800 can differ from that of FIG. 7A, in that a second precharge circuit 822 can provide a low impedance path prior to a compare operation, based on one signal (e.g., CLK), and after a compare operation only in the event the result line substantially changes in potential. Thus, a precharge control circuit 824 can receive not only a precharge clock signal P_CLK, but can also receive signal MATCHB, which can indicate a compare operation result.

An operation of the embodiment of FIG. 8A will now be described with reference to FIG. 8B.

FIG. 8B is a timing diagram showing states of a clock signal CLK, a first precharge circuit 802 (PRECH1), second precharge circuit 822 (PRECH2), a compare timing signal CMP_CLK, a precharge clock signal P_CLK, a potential of result line 808, and signal MATCHB.

Prior to time t0, in response to a transition in signal CLK, precharge control circuit 824 can generate an active pulse in precharge clock P_CLK (in this case a high pulse).

In response to the active pulse, second precharge circuit 822 can be placed into a low impedance state, and result line 808 can be precharged to about V1, if not already at such a level. Precharge clock P_CLK can return to an inactive level, and second precharge circuit 822 can return to a high impedance state.

At about time t0, compare control signal CMP_CLK can transition to a high level, indicating the start of a compare operation. In response to the compare operation, cell compare circuits 810 can provide one or more low impedance paths, and result line 808 can discharge toward the voltage at second potential node 814. A sense amplifier circuit 816 can detect the potential change in result line 808 can drive signal MATCHB high, indicating a particular compare result.

At about time t1, a compare operation can end with compare control signal CMP_CLK returning to an inactive level. Because, signal MATCHB is high at this time, precharge control circuit 822 can generate another active pulse in response to signal CMP_CLK, placing second precharge circuit 822 into a low impedance state once again. This can drive a result line potential 808 back to a precharged state.

Operations prior to time t2, can be essentially the same as that prior to time t0.

At about time t2, in response to the compare operation, cell compare circuits 810 can maintain high impedance paths, and result line 808 can remain at or near the precharged level (i.e., not have a significant change in potential). As a result, sense amplifier circuit 816 can maintain signal MATCHB at the low level.

At about time t3, a compare operation can end with compare control signal CMP_CLK returning to an inactive level. However, because signal MATCHB is low at this time, precharge control circuit 822 will not generate another active pulse in response to signal CMP_CLK returning to a low level.

Reference to the waveform ML of FIG. 8B shows how precharge current can be reduced. In the event a compare operation causes a significant drop in potential of result line, two precharge pulses can be used to return the potential to a precharged level. However, in the event a compare operation does not cause a significant drop in the potential of the result line, only one precharge pulse may be needed to return the potential to a precharged level, thus a second pulse is not generated.

Of course, as in the case of FIGS. 7A and 7B, in the arrangement of FIGS. 8A and 8B, a first precharge circuit 802 can be activated according to any of the approaches described herein.

In this way, a precharge circuit can be enabled prior to a compare operation, and then conditionally enabled after a compare operation according to a compare result.

Figure 9A:
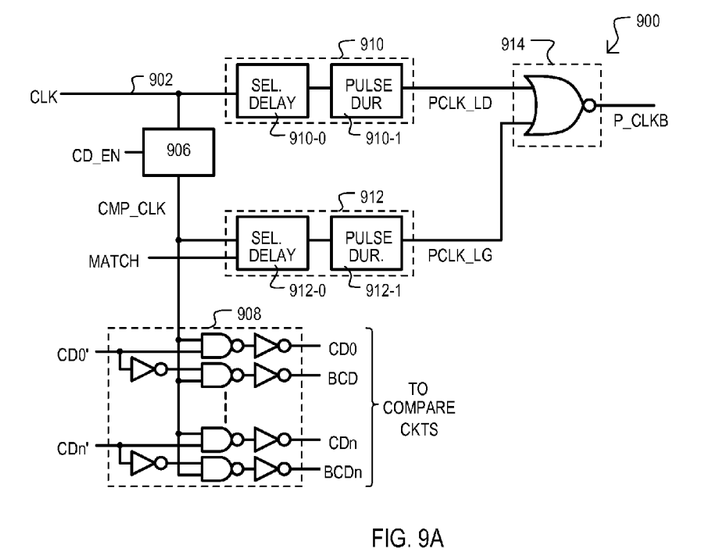
FIG. 9A is a block schematic diagram of a precharge control circuit according to a further embodiment of the invention.

Referring now to FIG. 9A, an example of a precharge control circuit is shown in a block schematic diagram and designated by the general reference character 900. In one particular arrangement, a precharge control circuit 900 can be utilized as precharge control circuit shown as 824 in FIG. 8A.

A precharge control circuit 900 can differ from that of FIG. 3A in that it can include a lead pulse generator 910, a lag pulse generator 912, and combining logic 914. A lead pulse generator 910 can generate a pulse in signal PCLK_LD that can precede a compare operation. Such a pulse can be generated in response to a clock signal CLK. In the very particular example shown, lead pulse generator 910 can include a selectable delay circuit 910-0 and a pulse duration circuit 910-1. A selectable delay circuit 910-0 can delay a signal CLK to generate the start of a pulse for signal PCLK_LD. A pulse duration circuit 910-1 can establish the duration of PCLK_LD pulse, and thus dictate when such a pulse ends. Circuits 910-0 and 910-1 can operate in the same general fashion as circuits 304-0 and 304-1 shown in FIG. 3A.

A lag pulse generator 912 can generate a pulse in signal PCLK_LG that can follow a compare operation. Such a pulse can be generated in response to the end of an active compare control signal CMP_CLK (falling edge in the example shown). In the very particular example shown, lag pulse generator 912 can include the same general sections as lead pulse generator 910. Optionally, a lag pulse generator 912 can be enabled or disabled in response to a signal MATCHB. As but one example, lag pulse generator can be disabled when signal MATCHB is inactive (low in this case).

Combining logic 914 can logically combing signals PCLK_LG and PCLK_LD to generate a precharge signal P_CLKB, that is active low. In the very particular example shown, combining logic 914 can be a NOR gate that having inputs that receive signals PCLK_LD and PCLK_LG and an output that provides a precharge signal P_CLKB.

Figure 9B:
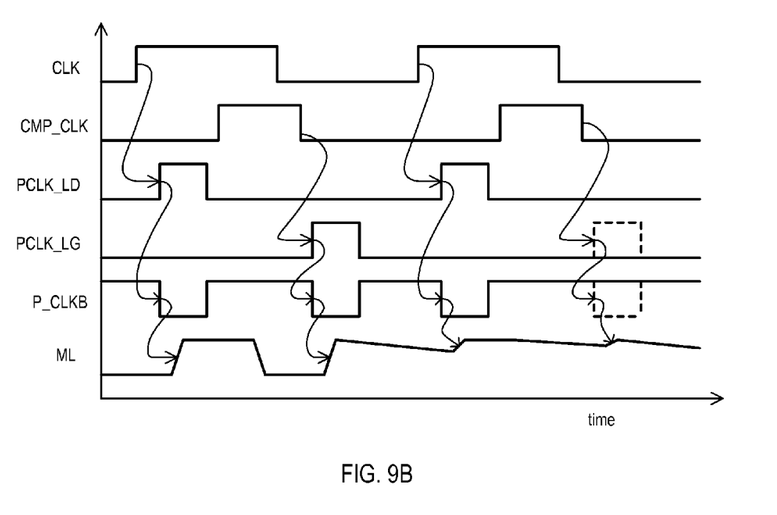
FIG. 9B is a timing diagram showing an operation of the circuit of FIG. 9A.

FIG. 9B shows one example of the operation of precharge control circuit 900. FIG. 9B follows the response shown in FIG. 8B, but includes waveforms for signals PCLK_LG and PCLK_LD. A second pulse for waveform PCLK_LG is shown with dashed lines to illustrate how such a pulse can be selectively disabled according to a compare result.

Referring still to FIG. 9B it is also noted that a signal P_CLKB can include two pulses between compare operations (between a falling edge and subsequent rising edge of signal CMP_CLK) provided sufficient time exists. However, if a device is operated at a faster speed, such pulses can converge to a single pulse. Similarly, if such pulses are extended in duration, they can converge to a single pulse.

In this way, a control circuit can generate pulse that lead, and can selectively lag, a compare operation.

The various embodiments above have shown arrangements that can include cell compare circuits connected to a result line. Particular examples of such cell compare circuits will now be described.

Figure 10A:
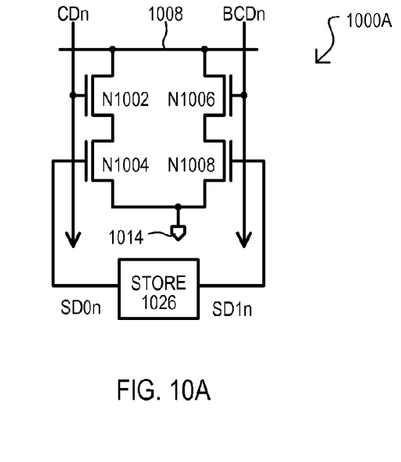
FIGS. 10A to 10C are schematic diagrams showing compare circuits that can be included in embodiments of the invention.

FIG. 10A shows a schematic diagram of a first example of a cell compare circuit 1000A. The cell compare circuit 1000A can include two "legs" connected between a result line 1008 and a second potential node 1014. One leg can include two n-channel FETs N1002/N1004 having source-drain paths arranged in series with one another. Transistor N1002 can receive a compare signal CDn at its gate, while transistor N1004 can receive a stored data value SD0$n$ at its gate. Another leg can include two n-channel FETs N1006/N1008 having source-drain paths arranged in series with one another. Transistor N1006 can receive a compare signal BCDn at its gate, while transistor N1008 can receive a stored data value SD1$n$.

Values SD0$n$ and SD1$n$ can be provided by a storage circuit 1026 and can vary according to device configuration. As but two examples, in a binary CAM device, values SD0$n$ and SD1$n$ can be complementary values. In an "XY" ternary CAM device, such values can be complementary, or the same to provide a masking stored data value. Preferably, cell compare circuit 1000A and storage circuit 1026 can be included in the same memory cell.

In one very particular arrangement, prior to a compare operation, signals CDn/BCDN can be low. During a compare operation, signals CDn/BCDn can be driven to complementary values. Thus, depending upon the values SD0$n$ and SD1$n$, a low impedance can be created by one of the legs. In other arrangements, signals CDn/BCDn can be driven to a same level to provide a masked result.

Figure 10B:
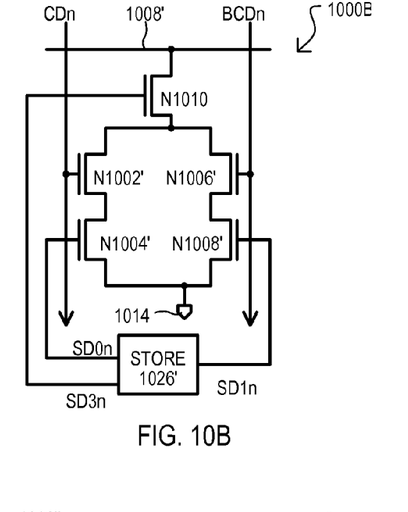

Referring now to FIG. 10B another possible cell compare circuit that can be included in the embodiments is shown in a schematic diagram, and designated by the general reference character 1000B. Cell compare circuit 1000B can include some of the same general structures as that of FIG. 1000A. However, cell compare circuit 1000B can differ in that it includes further includes an n-channel transistor N1010 having a source-drain path arranged in series with the two legs that receives a value SD3n at its gate.

A value SD3n can be provided by a storage circuit 1026' and can vary according to device configuration. As but one example, in a "VM" type ternary CAM cell, value SD3n can be a mask value, while values SDn and SD1n can be complementary values.

Figure 10C:
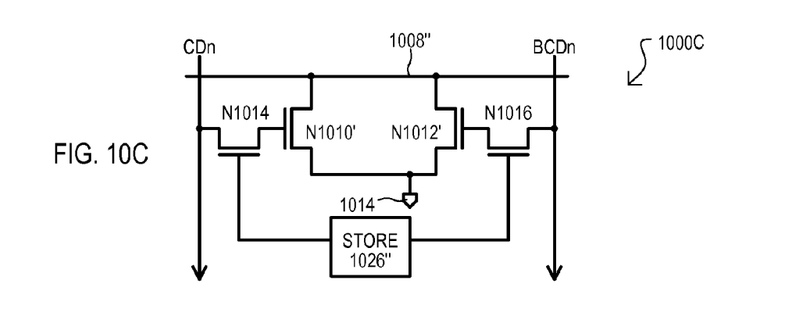

FIG. 10C shows yet another possible cell compare circuit that can be included in the embodiments. Cell compare circuit 1000C can include legs formed by single n-channel FETs N1010' and N1012', each having source-drain paths connected between a result line 1008 and a potential node 1014. Also included are n-channel FETs N1014 and N1016. Transistor N1014 can have a source-drain path connected between a source of signal CDn and a gate of transistor N1010'. Transistor 1014 can have a gate that receives a stored data value SD0n. In a similar fashion, transistor N1016 can have a source-drain path connected between a source of signal BCDn and a gate of transistor N1012', and a gate that receives a stored data value SD1n.

In this way, cell compare circuits used in the embodiments can include one or more transistors having source-drain paths that are placed into high or low impedance states according to a comparison between a stored data value and compare data value signal.

Figure 11:
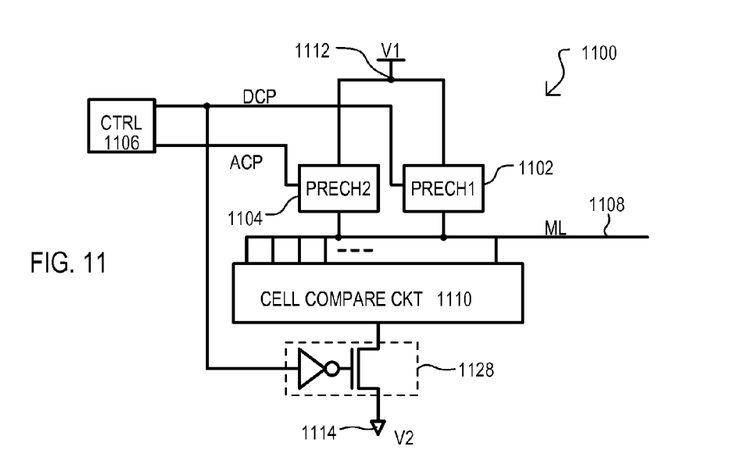
FIG. 11 is a block schematic diagram of a compare circuit according to an eighth embodiment of the invention.

Referring now to FIG. 11, a compare circuit according to another embodiment is shown in a block schematic diagram and designated by the general reference character 1100. A compare circuit 1100 can include some of the same general sections as the embodiment of FIG. 1A, thus like sections are referred to by the same reference character but with the first digit being a "11" instead of a "1".

FIG. 11 shows a compare circuit that can provide for current draw reduction by including an isolation circuit that can provide a low impedance during a first part of a compare operation, and then provide a high impedance path for a remaining part of the compare operation.

Compare circuit 1100 can differ from that of FIG. 1A, in that an isolation circuit 1128 can be included between cell compare circuits 1110 and second potential node 1114. An isolation circuit 1128 can provide a current path between cell compare circuits 1110 and second potential node 1114 according to control value DCP provided from a precharge control circuit 1106. Thus, an isolation circuit 1128 can provide a low or high impedance path in the same general fashion as first precharge circuit 102 described in conjunction with FIGS. 1A and 1B.

It is noted that while a first precharge circuit 1102 and second precharge circuit 1104 can operate like those shown as 102 and 104 in FIG. 1A, such an arrangement should not be construed as limiting. For example, first and second precharge circuits (1102 and 1104) can operate according to the various other embodiments herein.

While embodiments described above, such as that shown in FIG. 6A, have shown compare circuits that include a "wire-NOR" (or "wire-OR") arrangement in which compare circuit paths are arranged in parallel with another with respect to a result line, other embodiments can include wire-AND (or "wire-NAND") type arrangements in which compare circuit paths are arranged in series with one another. One such arrangement is shown in FIG. 12.

Figure 12:
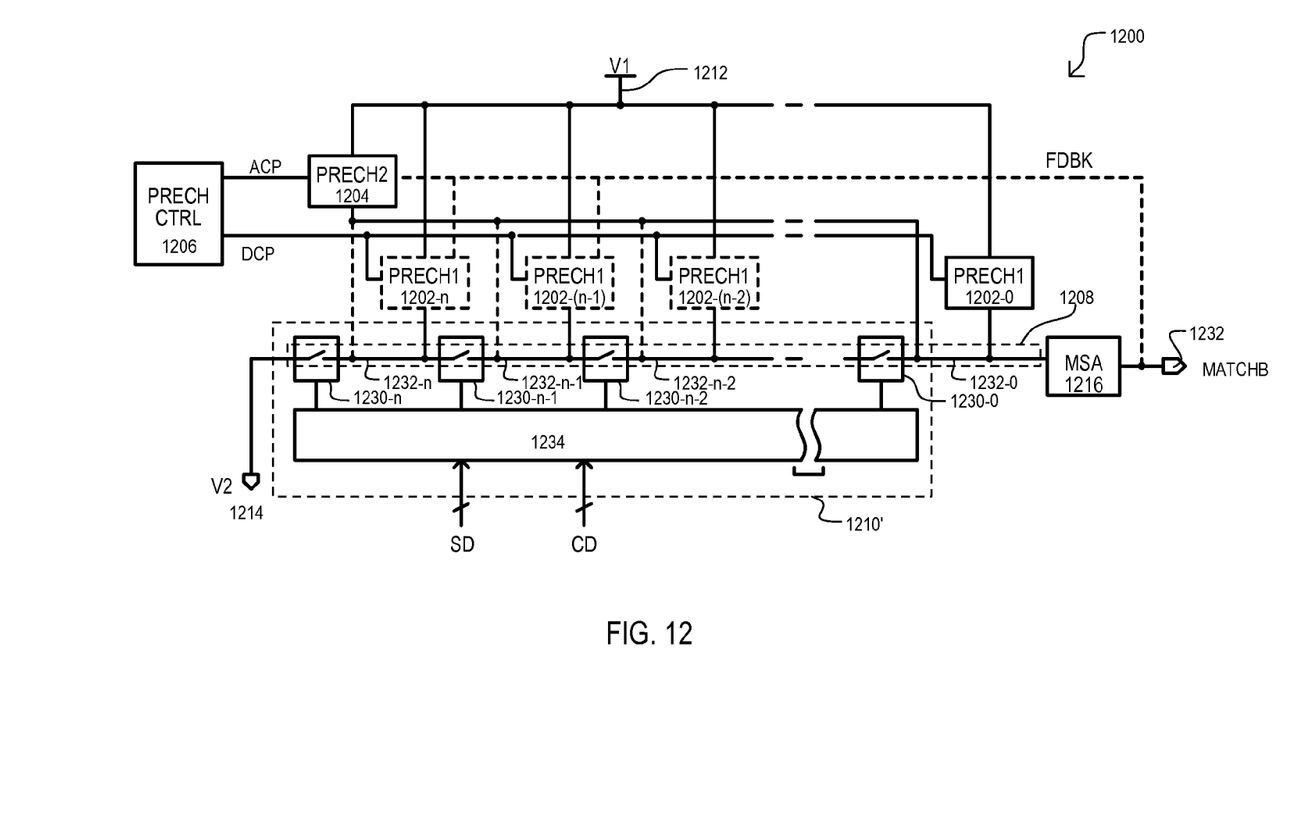
FIG. 12 is a block schematic diagram of a compare circuit according to a ninth embodiment of the invention.

Referring now to FIG. 12, a compare circuit according to yet another embodiment is shown in a block schematic diagram and designated by the general reference character 1200.

A compare circuit 1200 can include one or more first precharge circuits 1202-0 to 1202-n, one or more second precharge circuits 1204, a precharge control circuit 1206, a result line 1208, a number of cell compare circuits 1210', and a sense amplifier 1216.

Cell compare circuits 1210' can include a series of controllable current paths 1230-0 to 1230-n arranged in series with one another between sense amplifier 1216 and a second potential node 1214. The series connection of controllable current paths (1230-0 to 1230-n) can form a result line 1208, and can be connected to one another by result nodes 1232-0 to 1232-n. Controllable current paths (1230-0 to 1230-n) can be placed into high or low impedance states according to comparison between a stored data value SD and a received compare data value CD, as determined by value compare circuits 1234.

A compare circuit 1200 can execute a compare operation by first precharging result nodes (1232-0 to 1232-n) at, or toward, a voltage. Subsequently, controllable current paths (1230-0 to 1230-n) can be placed into a high or low impedance to thereby generate a compare result. Even more particularly, for one compare result, at least one controllable current path (1230-0 to 1230-n) can be placed into a high impedance, thus result node 1232-0 can be prevented from being driven to, or toward, potential V2 at second potential node 1214. In contrast, for another compare result, all controllable current path (1230-0 to 1230-n) can be placed into a low impedance, thus result node 1232-0 can be driven to, or toward, potential V2, resulting in a significant change in potential at result node 1232-0. This can be detected by sense amplifier 1232, which can generate a change in output signal MATCHB.

It is noted that a compare circuit 1200 can include as few as one of the first precharge circuits (1202-0 to 1202-n). Such a first precharge circuit can be connected to one or more result nodes, and thus provide a current path between result line 1208 and a first potential node 1212 according to control value DCP provided from precharge control circuit 1206. More particularly, a control value DCP can result in first precharge circuit(s) providing a low impedance path for a first portion of a compare operation, and a high impedance for a subsequent portion of a compare operation. A control value DCP can be one signal, or a collection of signals.

In a similar fashion, a compare circuit 1200 can include as few as one second precharge circuit 1204. In the event one second precharge circuit is included, such a precharge should be capable of charging all result nodes (1232-0 to 1232-n) to about V1. Preferably, this can be accomplished by having a second precharge circuit provide a precharge path to all such nodes, as shown in the arrangement of FIG. 12.

Optionally, a compare result from one result node can be fed back to a first precharge circuit to selectively prevent such a first precharge circuit from being turned off, as in the case of FIG. 4A, 5A or 6A. Further, while a final match result MATCHB can be fed back to any first precharge circuit, in other arrangements, the potential at one result node can be fed back to a first precharge circuit connected to the same or a previous result node.

Similarly, a compare result from one result node can be fed back to a second precharge circuit to disable one of multiple precharge pulses, as shown in FIG. 8A.

Thus, in a wire-AND or wire-NAND type arrangement, first precharge circuit(s) (1202-0 to 1202-n) or second precharge circuit(s) (1202-0 to 1202-n) can operate according to the timing shown in any of the above embodiments.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
   selectively coupling a result line to a reference node in response to a compare data value being applied to a plurality of compare cell circuits;
   precharging the result line to a precharge potential by enabling a first precharge path while the compare data value is being applied;
   after precharging the result line by enabling the first precharge path, disabling the first precharge path to place it in a high impedance state; and
   disabling the first and second precharqe paths in response to at least validity data that indicates validity of data stored in the compare cell circuits.

2. The method of claim 1, wherein:
   precharging the result line by enabling the first precharge path includes enabling the first precharge path in response to at least a periodic clock signal.

3. The method of claim 1, wherein:
   disabling the first precharge path includes disabling the first precharge path in response to at least a periodic clock signal.

4. The method of claim 3, wherein:
   disabling the first precharge path includes disabling the first precharge path further in response to at least a potential of the result line.

5. The method of claim 1, wherein:
   the compare data value is applied to the compare cell circuits in response to a periodic signal.

6. The method of claim 1, further including:
   precharging the result line to the precharge potential by enabling and disabling the second precharge path before the compare data value is applied.

7. An integrated circuit device, comprising:
   a compare cell circuit that couples a result line to a reference voltage according to a comparison result between a stored data value and an applied compare data value during a compare time period; and
   a first precharge circuit that is enabled to provide a low impedance path between the result line and a precharge voltage node during a portion of a precharge period preceding the compare time period, and is disabled to substantially isolate the result line from the precharge voltage node during a portion of the compare time period.

8. The integrated circuit device of claim 7, wherein:
   the first precharge circuit is disabled in response to at least a periodic signal.

9. The integrated circuit device of claim 8, further including:
   a plurality of compare data lines coupled to the compare cell circuit that provide the applied compare data value in response to the periodic signal.

10. The integrated circuit device of claim 7, wherein:
    the first precharge circuit is disabled in response to at least a potential of the result line.

11. The integrated circuit device of claim 7, further including:
    a second precharge circuit that is enabled to provide a low impedance path between the result line and the precharge voltage node during a portion of the precharge period, and is disabled to substantially isolate the result line from the precharge voltage node prior to the compare time period.

12. The integrated circuit device of claim 11, wherein:
    the second precharge circuit is enabled in response to at least a periodic clock signal.

13. The integrated circuit device of claim 7, wherein:
    the compare cell circuit includes a plurality of content addressable memory (CAM) cells having at least two transistors of a first conductivity type arranged in series with one another; and
    the first precharge circuit includes at least one transistor of a second conductivity type.

14. An integrated circuit device, comprising:
    a compare cell circuit that selectively couples a result line to a reference voltage according to a comparison result between a stored data value and an applied compare data value during a compare period;
    a first precharge path to the result line that is enabled during a portion of a precharge period which precedes the compare time period, and disabled during the compare time period; and
    a second precharge path to the result line that is enabled during at least a portion of the precharge period, and disabled during at least a portion of the compare period; wherein
    the first and second precharge paths are disabled in response to at least validity data that indicates a validity of the data stored value in the compare cell circuit.

15. The integrated circuit device of claim 14, wherein:
    the first precharge path is enabled in the precharge period prior to the second precharge path being enabled in the precharge period.

16. The integrated circuit device of claim 14, wherein:
    the first precharge path is disabled in the precharge period prior to the second precharge path being enabled in the precharge period.

17. The integrated circuit device of claim 14, wherein:
    the first precharge path is disabled in the precharge period after the second precharge path is enabled in the precharge period.

18. The integrated circuit of claim 14, further including:
    a precharge control circuit coupled to receive at least one periodic clock signal that generates a first control signal and a second control signal; and
    the first precharge path is enabled and disabled in response to at least the first control signal; wherein
    the second precharge path is enabled and disabled in response to at least the second control signal.

* * * * *